United States Patent
Ren et al.

(10) Patent No.: US 7,573,416 B1
(45) Date of Patent: Aug. 11, 2009

(54) ANALOG TO DIGITAL CONVERTER WITH LOW POWER CONTROL

(75) Inventors: Juxiang Ren, Austin, TX (US); Edward J. Hathaway, Austin, TX (US); Jayme W. Richard, Dripping Springs, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/112,060

(22) Filed: Apr. 30, 2008

(51) Int. Cl.
*H03M 1/12* (2006.01)
(52) U.S. Cl. .......................... 341/155; 341/158
(58) Field of Classification Search .......... 341/155, 341/158, 154
See application file for complete search history.

(56) References Cited

U.S. PATENT DOCUMENTS

| | | | | |
|---|---|---|---|---|
| 4,992,791 | A * | 2/1991 | Olson | 341/126 |
| 5,619,204 | A * | 4/1997 | Byrne et al. | 341/155 |
| 5,892,381 | A | 4/1999 | Koifman et al. | |
| 6,885,236 | B2 * | 4/2005 | Vorenkamp | 327/540 |
| 6,963,298 | B2 * | 11/2005 | Otsuka et al. | 341/155 |
| 7,279,960 | B1 * | 10/2007 | Lee | 327/538 |
| 7,501,972 | B2 * | 3/2009 | Wakamatsu | 341/155 |

OTHER PUBLICATIONS

Freescale Semiconductor, Inc. MPC5567 Microcontroller reference Manual, Devices Supported: MPC5567, Rev. 1, Jan. 2007.

* cited by examiner

*Primary Examiner*—Peguy JeanPierre
(74) *Attorney, Agent, or Firm*—James L. Clingan, Jr.; Daniel D. Hill

(57) ABSTRACT

A circuit comprises a reference voltage generating circuit, a first switch, a second switch, and a capacitive element. The reference voltage generating circuit has an input and output terminal for providing a reference voltage. The first switch has a first terminal coupled to a first power supply voltage terminal, a second terminal coupled to the input terminal of the reference voltage generating circuit, and a control terminal for receiving a first control signal. The second switch has a first terminal coupled to the output terminal of the reference voltage generating circuit, a second terminal, and a control terminal for receiving a second control signal. The capacitive element has a first plate electrode coupled to the second terminal of the second switch, and a second plate electrode coupled to a second power supply voltage terminal.

20 Claims, 1 Drawing Sheet

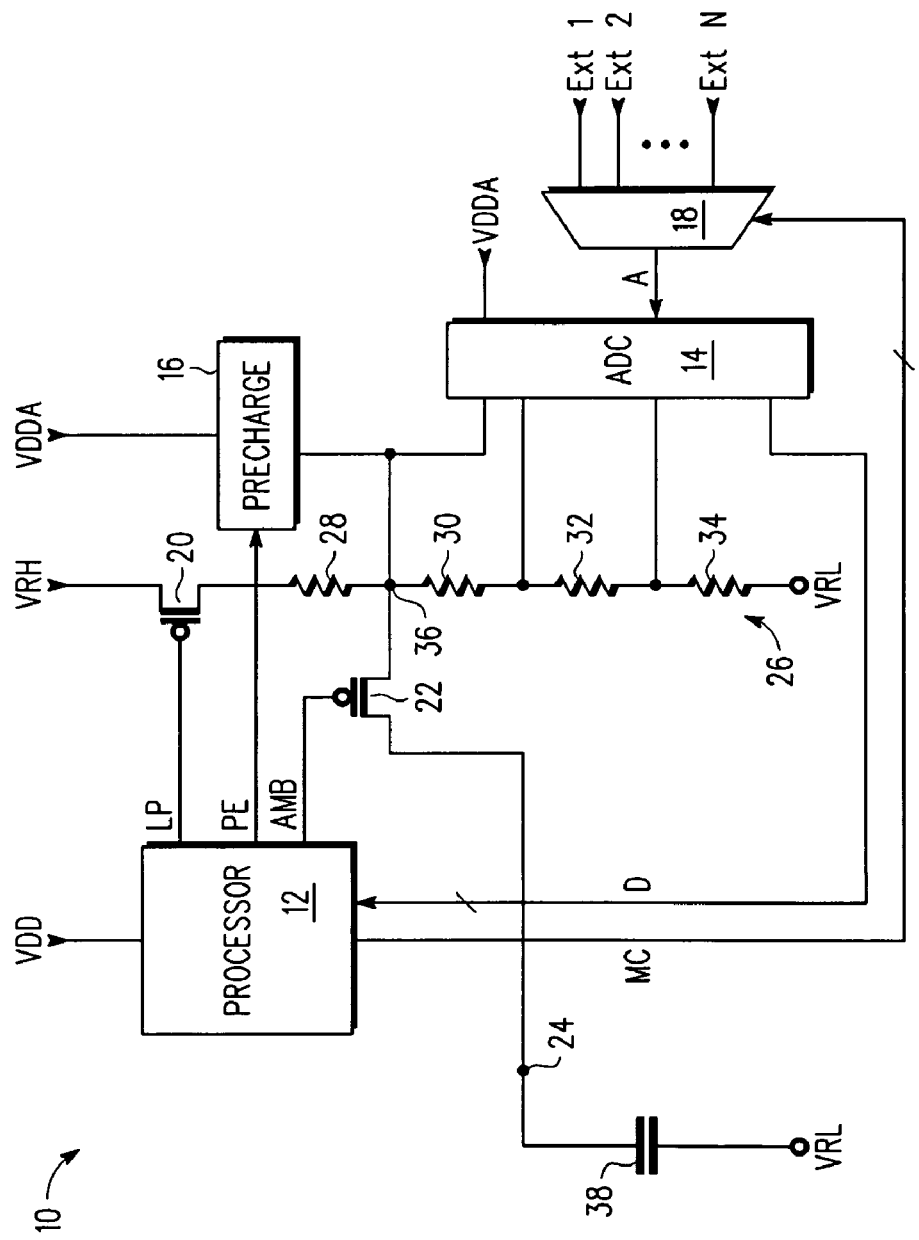
FIGURE

ANALOG TO DIGITAL CONVERTER WITH LOW POWER CONTROL

BACKGROUND

1. Field

This disclosure relates generally to analog to digital converters, and more specifically, to analog to digital converters with low power control.

2. Related Art

Analog to digital converters (ADCs) are commonly used in processors where analog signals are present, such as automotive applications. For example, many measurements, such as temperature, are received as an analog signal and the processor must use or display that information digitally. Especially for applications involving a battery, which does include automotive applications, power savings is very important. One of the ways this is achieved is by operating the processor in a power savings mode when the processor is not actually performing desired functions. The processor, however, must be able to detect when it is time to come out of the power savings mode. Thus, the processor typically must be powered in some form in order to perform the determination that it is time to come out of the power savings mode. For an automotive application, for example, this cannot be predicted with any certainty. The time between uses can be measured in seconds or weeks. This is compounded by the various circuits that must be able to function in order to begin to come out of the power savings mode. Each of these circuits, including the ADCs, are potentially power consumers that can drain a battery.

Thus there is a need for a processor to utilize a power savings mode in which the circuits that it uses can reduce power consumption associated with the power savings mode.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

The sole FIGURE is a combination block and circuit diagram of a circuit according to an embodiment.

DETAILED DESCRIPTION

In one aspect, a processing unit has a processor and an analog to digital converter (ADC) in which the processing unit has a power savings mode and an active mode. During the power savings mode, the processing unit switches between a low power mode and a check mode. During the check mode, the processor determines if the processing unit should switch to the active mode or stay in the power savings mode. During the check mode, power required for the ADC to provide a high precision output is not applied to the ADC. Instead, power is applied to the ADC that results in a less precise output but one that is achieved much more quickly. Thus the ADC provides a sufficiently accurate output for the processor to determine if the processing unit should enter the active mode more quickly than would be achieved using the more precise method. A particular way that the reduced power consumption is achieved is by preventing the charging of a capacitor during the check mode. The capacitor is important in reducing noise on a reference used by the ADC. The reduced noise allows the ADC to provide a more precise output. For the purposes of the processor determining if the active mode should be entered, the enhanced precision arising from the capacitor is not required. Thus, power is saved by not charging the capacitor when switching from the low power mode to the check mode and not having to spend nearly as much time in the check mode as would be required if the capacitor had to be charged in switching from the low power mode to the check mode. This is better understood by reference to the following description and the drawing.

Shown in the sole FIGURE is a processing unit 10, which is preferably an integrated circuit, comprising a processor 12, an analog to digital converter (ADC) 14, a precharge circuit 16, a multiplexer 18, a P channel transistor 20, a P channel transistor 22, an external connection 24, a reference voltage generating circuit 26, and a node 36. Reference voltage generating circuit 26, which functions as a resistor divider, comprises resistors 28, 30, 32, and 34. Transistors 20 and 22 functions as switches. Also shown in the FIGURE is a capacitor 38 which is preferably external to processing unit 10. As a capacitor, capacitor 38 has plate electrodes connected to terminals. Processor 12 receives power through a power supply terminal VDD. Power supply terminal VDD is for receiving the main power for logic operations of processing unit 10. Processor 12 receives a data signal D from ADC 14 and provides a low power mode signal LP to a gate of transistor 20, a precharge enable signal PE to precharge circuit 16, an active mode bar signal AMB to a gate of transistor 22, and a mux control signal MC to multiplexer 18. ADC 14 and precharge circuit 16 receive power from an analog power supply terminal VDDA. Analog power supply terminal VDDA is for receiving power for use by analog circuits of processing unit 10. The analog circuits need a less noisy power supply than do the logic circuits. Transistor 20 has a source connected to a voltage reference high terminal VRH. Voltage reference high terminal VRH is for powering voltage reference generating circuit 26 and has a particularly high requirement for being low noise. Resistor 28 has a first terminal connected to a drain of transistor 20 and a second terminal connected to a first reference input of ADC 14 and an output of precharge circuit 16. Resistor 30 has a first terminal connected to the second terminal of resistor 28 and a second terminal connected to a second reference input of ADC 14. The common connection of the second terminal of resistor 28 and the first terminal of resistor 30 with the first input of ADC 14 and the output of precharge circuit 16 is shown as node 36. Resistor 32 has a first terminal connected to the second terminal of resistor 30 and a second terminal connected to a third reference input of ADC 14. Resistor 34 has a first terminal connected to the second terminal of resistor 32 and a second terminal connected to a voltage reference low terminal. Voltage reference low terminal is for being connected to ground potential but in a way that preferably has as little current as possible through it and therefore is very low noise. Multiplexer 18 has a plurality of inputs for receiving signals external to processing unit 10. These signals are shown as external signals, ext 1, ext 2, and ext N. These external signals are analog signals and are selectively coupled to ADC 14 as analog signal A under the control of processor 12. ADC 14 converts the selected analog signal to data signal D which is a digital signal and which is received by processor 12. Transistor 22 has a source connected to node 36 and a drain connected to an external terminal 24. Capacitor 38 has a first terminal connected to external node 24 and a second terminal connected to voltage reference low terminal VRL.

In the case of processing unit 10 being in the active mode, processor 12 selects one of the analog external signals, ext 1, ext 2, or ext N, for coupling to ADC 14. ADC 14 converts the received signal A to a digital data signal D received by processor 12. Reference voltage generating circuit 26 divides the voltage applied at terminal VRH into fourths. This is easily achieved with resistors 28, 30, 32, and 34 being of equal resistance. The actual value of the resistance is not particularly significant but it is important that they be the same resistance. This criterion is compatible with the capabilities of semiconductor processing. Thus at node 36 is a voltage that is 75 percent of the voltage at terminal VRH. At the node connecting resistors 30 and 32, the voltage is 50 percent of the voltage at terminal VRH. At the node connecting resistors 32 and 34, the voltage is 25 percent of the voltage at terminal VRH. These three equally spaced voltages are very useful in ADC 14 providing an accurate analog to digital conversion. The use of providing multiple reference voltages for providing an accurate analog to digital conversion is well understood in the art. Capacitor 38 provides for noise reduction on the three equally spaced reference voltages. Precharge circuit 16 is for improving the speed at which capacitor 38 becomes charged to its ultimate value of 75 percent of the voltage at terminal VRH, especially when coming out of the power savings mode. Even with the assistance of precharge circuit 16, it can still take nearly 10 milliseconds for node 36 to reach the desired 75 percent value of the voltage at terminal VRH for recommended values for the capacitance of capacitor 38. The recommended value may be 100 nanofarads. In the active mode, transistor 22 receives signal AMB at a logic low. In this case, the active mode is indicated by a logic low and is so designated by the "B" in AMB. Transistor 22 is thus conductive in the active mode and keeps capacitor 38 coupled to node 36 in the active mode.

For the case of transferring from the active mode to the power savings mode, signal LP and signal AMB become a logic high which causes transistors 20 and 22 become non-conductive. Transistor 20, being non-conductive, blocks current flow from terminal VRH through reference voltage generating circuit 26. With transistor 22 being non-conductive, the voltage on capacitor 38 dissipates to the voltage at VRL as a result of leakage. Precharge circuit 16 and ADC 14 are placed into a low power mode. Processor 12 may have power savings applied to portions of its internal workings. This initial portion of the power savings mode where the circuits are mostly not powered and have minimal functionality may be called a low power mode.

Processing unit also periodically checks to see if needs to become operational for its intended purpose. In the check mode ADC 14, which becomes powered, needs to provide selected information to processor 12. This information, however, does not have the same level of precision needed as for operation of ADC during the active mode. Thus, instead of charging capacitor 38 to obtain the benefits of low noise operation, transistor 22 is kept non-conductive by processor 12 keeping signal AMB at a logic high during the check mode. Processor 12 switches signal LP to a logic low so that transistor 20 becomes conductive. Reference voltage generating circuit 26 thus provides the voltages of 25, 50, and 75 percent of the voltage at terminal VRH to ADC 14 without being delayed by having to charge the capacitance of capacitor 38. This can be accomplished in less than 20 microseconds which is nearly 3 orders of magnitude than that required with capacitor 38 coupled to node 36. Thus, the functionality of ADC 14 needed during the check mode is available without requiring the charging of capacitor 38. One beneficial affect of this is that processor 12 can perform the required check during the check mode without having to wait for capacitor 38 to become charged. This allows for a much faster to the low power mode if the check shows that the active mode does not have to be entered. Another benefit is that the current required to charge capacitor is not wasted as would be the case if capacitor 38 was charged but the active mode is not entered. Also, if capacitor 38 remained charged and reference voltage generating circuit remained activated during the low power mode, the low power mode would be less effective in reducing power drain.

If the check mode determines that the active mode is to be entered, processor 12 switches signal AMB to a logic low and signal PE to a logic high. When this happens, node 36 is dropped to a voltage near the voltage at terminal VRL but begins rising due to the charging of capacitor 38 by precharge circuit 16, which becomes powered and to a lesser extent through resistor 28 and transistor 20. Processor 12 must wait the needed time to bring node 36 to 75 percent of the voltage at terminal VRH and may then begin precision operations using ADC 14.

If the check mode determines that processing system is to return to the low power mode portion of the power savings mode, then processor 12 switches signal LP back to a logic high so that transistor 20 becomes non-conductive so that power stops being applied to reference voltage generating circuit 26. ADC 14 and precharge circuit 16 are returned to their low power mode. The resulting conditions are the same as previously described for the low power mode. Reducing time required in the check mode results in increasing the time in the low power mode and thus results in reducing power consumption in the power savings mode of processing unit 10. Thus, the use of transistor 22 to isolate capacitor 38 during the check mode results in power savings during the power savings mode.

By now it should be appreciated that there has been provided a circuit including a reference voltage generating circuit having an input and an output terminal for providing a reference voltage. The circuit further includes a first switch having a first terminal coupled to a first power supply voltage terminal, a second terminal coupled to the input and the output terminal of the reference voltage generating circuit, and a control terminal for receiving a first control signal. The circuit further includes a second switch having a first terminal coupled to the input and the output terminal of the reference voltage generating circuit, a second terminal, and a control terminal for receiving a second control signal. The circuit further includes a capacitive element having a first plate electrode coupled to the second terminal of the second switch, and a second plate electrode coupled to a second power supply voltage terminal. The circuit may be further characterized by the first control signal being a low power mode signal provided by a processor. The circuit may further comprise an analog-to-digital converter having a reference voltage input terminal for receiving at least one reference voltage from the reference voltage generating circuit. The circuit may be further characterized by the analog-to-digital converter being a redundant signed division analog-to-digital converter. The circuit may be further characterized by the reference voltage generating circuit comprising a plurality of series-connected resistive elements. The circuit may further comprise a precharge circuit coupled to the first terminal of the second switch, the precharge circuit for precharging the capacitive element to a predetermined voltage in response to a mode control signal. The circuit may be further characterized by the second control signal being provided in response to setting a register bit field of a processor. The circuit may be further characterized by the circuit being implemented as a portion of an integrated circuit and the capacitive element is external to the integrated circuit. The circuit may be further characterized by the second control signal being an active mode control signal.

Also described is a circuit including a voltage divider comprising a plurality of series-connected resistive elements. The circuit further includes a first switch having a first terminal coupled to a first power supply voltage terminal, a second terminal coupled to the plurality of series-connected resistive elements, and a control terminal for receiving a first control signal. The circuit further includes a second switch having a first terminal coupled to the plurality of resistive elements, a second terminal, and a control terminal for receiving a second control signal. The circuit further includes a capacitive element having a first plate electrode coupled to the second terminal of the second switch, and a second plate electrode coupled to a second power supply voltage terminal. The circuit may be further characterized by the second control signal being provided in response to setting a register bit field of a processor. The circuit may be further characterized by the voltage divider being for providing a reference voltage for use by an analog-to-digital converter. The circuit may be further characterized by the circuit being formed on an integrated circuit and the capacitive element being external to the integrated circuit. The circuit may be further characterized by the first and second switches being implemented as P-channel transistors. The circuit may be further characterized by the plurality of series-connected resistive elements comprising a first resistive element having a first terminal coupled to the second terminal of the first switch, and a second terminal coupled to the first terminal of the second switch, a second resistive element having a first terminal coupled to the second terminal of the first resistive element, and a second terminal, a third resistive element having a first terminal coupled to the second terminal of the second resistive element, and a second terminal, and a fourth resistive element having a first terminal coupled to the second terminal of the third resistive element, and a second terminal coupled to the second power supply voltage terminal. The circuit may further comprise a precharge circuit coupled to the first terminal of the second switch, the precharge circuit for precharging the capacitive element to a predetermined voltage in response to a mode control signal.

Described also is a method including determining that a circuit is needed to perform a first task requiring a first accuracy. The method also includes causing a reference voltage generating circuit to operate in an active mode. The method also includes providing a power supply voltage to the reference voltage generating circuit. The method also includes coupling a capacitor to the reference voltage generating circuit. The method also includes providing a reference voltage having the first accuracy from the reference voltage generating circuit to the circuit. The method also includes determining that the circuit is to operate in a low power mode. The method also includes causing the reference voltage generating circuit to enter the low power mode. The method also includes decoupling the power supply voltage from the reference voltage generating circuit. The method also includes decoupling the capacitor from the reference voltage generating circuit. The method also includes determining that the circuit is needed for a second task requiring a second accuracy, the second accuracy being less than the first accuracy. The method also includes providing the power supply voltage to the reference voltage generating circuit. The method also includes causing the reference voltage generating circuit to operate in a low accuracy active mode. The method also includes performing the second task at the second accuracy with the capacitor decoupled from the reference voltage generating circuit in the low accuracy active mode. The method may be further characterized by the providing a reference voltage having the first accuracy further comprising waiting a predetermined time period for the capacitor to fully charge. The method may be further characterized by the determining that a circuit is needed further comprising determining that an analog-to-digital converter circuit is needed. The method may be further characterized by the coupling a capacitor to the reference voltage generating circuit further comprising setting a control bit in a processor.

Although the invention is described herein with reference to specific embodiments, various modifications and changes can be made without departing from the scope of the present invention as set forth in the claims below. For example, the capacitor is shown as being external but the capacitor could be included as part of the integrated circuit of the processing unit. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A circuit comprising:
   a reference voltage generating circuit having an input and an output terminal for providing a reference voltage;
   a first switch having a first terminal coupled to a first power supply voltage terminal, a second terminal coupled to the input and the output terminal of the reference voltage generating circuit, and a control terminal for receiving a first control signal;
   a second switch having a first terminal coupled to the input and the output terminal of the reference voltage generating circuit, a second terminal, and a control terminal for receiving a second control signal; and
   a capacitive element having a first plate electrode coupled to the second terminal of the second switch, and a second plate electrode coupled to a second power supply voltage terminal.

2. The circuit of claim 1, wherein the first control signal is characterized as being a low power mode signal provided by a processor.

3. The circuit of claim 1 further comprising an analog-to-digital converter having a reference voltage input terminal for receiving at least one reference voltage from the reference voltage generating circuit.

4. The circuit of claim 3, wherein the analog-to-digital converter is characterized as being a redundant signed division analog-to-digital converter.

5. The circuit of claim 1, wherein the reference voltage generating circuit comprises a plurality of series-connected resistive elements.

6. The circuit of claim 1 further comprising a precharge circuit coupled to the first terminal of the second switch, the precharge circuit for precharging the capacitive element to a predetermined voltage in response to a mode control signal.

7. The circuit of claim 1, wherein the second control signal is provided in response to setting a register bit field of a processor.

8. The circuit of claim 1, wherein the circuit is implemented as a portion of an integrated circuit and the capacitive element is external to the integrated circuit.

9. The circuit of claim 1, wherein the second control signal is characterized as being an active mode control signal.

10. A circuit comprising:
   a voltage divider comprising a plurality of series-connected resistive elements;
   a first switch having a first terminal coupled to a first power supply voltage terminal, a second terminal coupled to the plurality of series-connected resistive elements, and a control terminal for receiving a first control signal;
   a second switch having a first terminal coupled to the plurality of resistive elements, a second terminal, and a control terminal for receiving a second control signal; and
   a capacitive element having a first plate electrode coupled to the second terminal of the second switch, and a second plate electrode coupled to a second power supply voltage terminal.

11. The circuit of claim 10, wherein the second control signal is provided in response to setting a register bit field of a processor.

12. The circuit of claim 10, wherein the voltage divider is for providing a reference voltage for use by an analog-to-digital converter.

13. The circuit of claim 10, wherein the circuit is formed on an integrated circuit and the capacitive element is external to the integrated circuit.

14. The circuit of claim 10, wherein the first and second switches are implemented as P-channel transistors.

15. The circuit of claim 10, wherein the plurality of series-connected resistive elements comprises:
   a first resistive element having a first terminal coupled to the second terminal of the first switch, and a second terminal coupled to the first terminal of the second switch;
   a second resistive element having a first terminal coupled to the second terminal of the first resistive element, and a second terminal;
   a third resistive element having a first terminal coupled to the second terminal of the second resistive element, and a second terminal; and
   a fourth resistive element having a first terminal coupled to the second terminal of the third resistive element, and a second terminal coupled to the second power supply voltage terminal.

16. The circuit of claim 10 further comprising a precharge circuit coupled to the first terminal of the second switch, the precharge circuit for precharging the capacitive element to a predetermined voltage in response to a mode control signal.

17. A method comprising:
   determining that a circuit is needed to perform a first task requiring a first accuracy;
   causing a reference voltage generating circuit to operate in an active mode;
   providing a power supply voltage to the reference voltage generating circuit;
   coupling a capacitor to the reference voltage generating circuit;
   providing a reference voltage having the first accuracy from the reference voltage generating circuit to the circuit;
   determining that the circuit is to operate in a low power mode;
   causing the reference voltage generating circuit to enter the low power mode;
   decoupling the power supply voltage from the reference voltage generating circuit;
   decoupling the capacitor from the reference voltage generating circuit;
   determining that the circuit is needed for a second task requiring a second accuracy, the second accuracy being less than the first accuracy;
   providing the power supply voltage to the reference voltage generating circuit;
   causing the reference voltage generating circuit to operate in a low accuracy active mode; and
   performing the second task at the second accuracy with the capacitor decoupled from the reference voltage generating circuit in the low accuracy active mode.

18. The method of claim 17, wherein providing a reference voltage having the first accuracy further comprises waiting a predetermined time period for the capacitor to fully charge.

19. The method of claim 17, wherein determining that a circuit is needed further comprises determining that an analog-to-digital converter circuit is needed.

20. The method of claim 17, wherein coupling a capacitor to the reference voltage generating circuit further comprises setting a control bit in a processor.

* * * * *